United States Patent [19]

Miller et al.

[11] 4,292,512

[45] Sep. 29, 1981

[54] OPTICAL MONITORING PHOTODIODE SYSTEM

[75] Inventors: Richard C. Miller, Summit; Bertram Schwartz, Westfield, both of N.J.

[73] Assignee: Bell Telephone Laboratories, Incorporated, Murray Hill, N.J.

[21] Appl. No.: 916,501

[22] Filed: Jun. 19, 1978

[51] Int. Cl.² ............................................. G01J 1/32
[52] U.S. Cl. .................................. 250/205; 357/19; 455/612; 455/613
[58] Field of Search ...................... 250/205, 226, 199; 357/19, 29, 30

[56] References Cited

U.S. PATENT DOCUMENTS 4,181,901  1/1980  Heyke ............................ 331/94.5 S

FOREIGN PATENT DOCUMENTS 2652608  5/1978  Fed. Rep. of Germany .

OTHER PUBLICATIONS

Merz et al., "J. Applied Physics," Aug. 1977, pp. 3580–3587.
"Laser Focus, " May 1978, p. 109.

*Primary Examiner*—David C. Nelms
*Assistant Examiner*—Darwin R. Hostetter
*Attorney, Agent, or Firm*—Michael J. Urbano

[57] ABSTRACT

The tracking problems of prior art optical monitoring (e.g., feedback stabilization) schemes are substantially alleviated by positioning a photodiode (PD 130) directly in the light path of the optical source (100) to be stabilized. The active (light-absorbing) layer (104) of the PD samples (absorbs) only a small portion of the light beam (140) emanating from the source and converts that portion to a photocurrent used in a feedback loop (120, 101) to control the excitation supplied to the source. The remaining, major portion (140') of the beam is transmitted unabsorbed through the PD active layer to utilization means (e.g., through an optical fiber 108 to a remote receiver). Advantageously, in one embodiment the PD is a double heterostructure (DH) in which the photocurrent is linearly related to the beam intensity. The use of discrete or integrated lens means (110, 110', 164, 166) to enhance coupling from the source to PD is described. In addition, tandem DH-PDs (150, 152) are also described which perform both detection, for demodulating encoded information at one optical frequency, and sampling, for feedback stabilization at another optical frequency.

4 Claims, 3 Drawing Figures

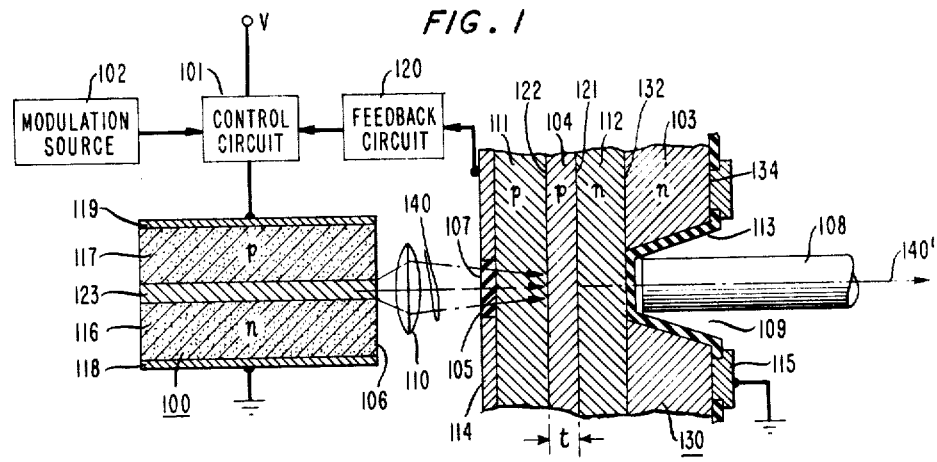
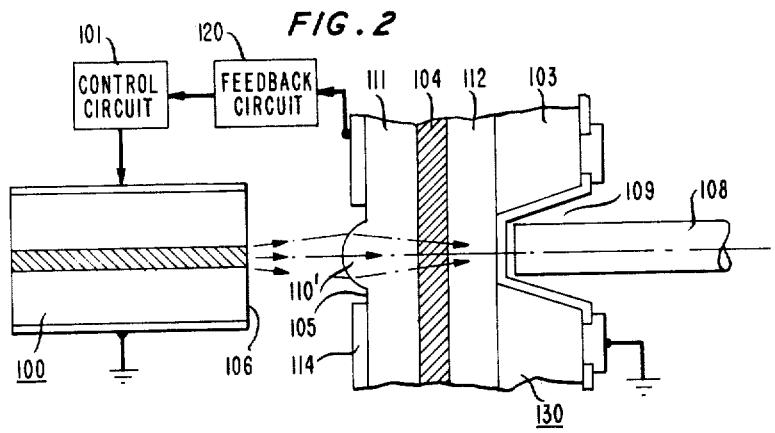
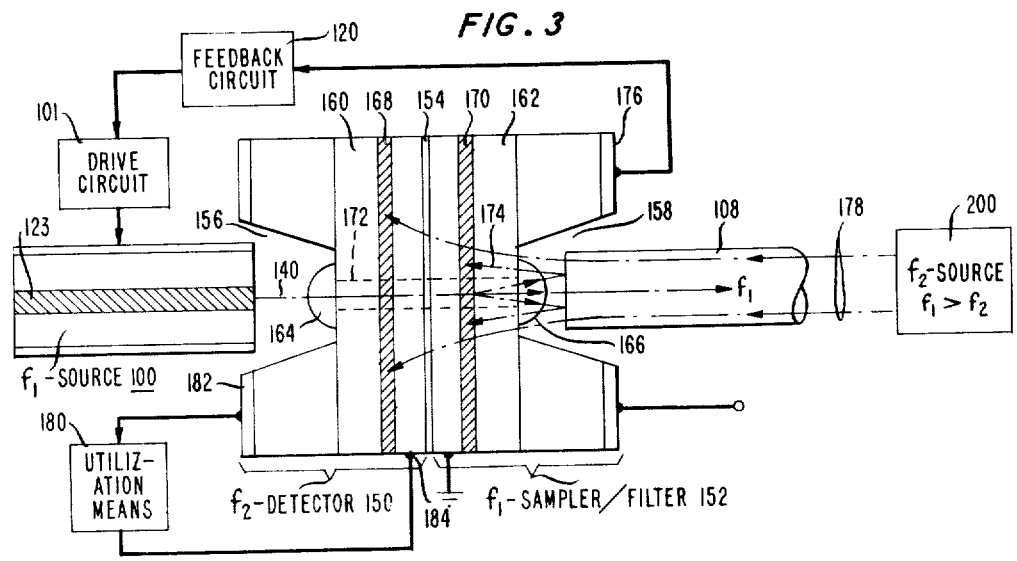

OPTICAL MONITORING PHOTODIODE SYSTEM

BACKGROUND OF THE INVENTION

This invention relates to optical monitoring systems.

The transmitter of many optical communications systems, especially those employing semiconductor lasers, typically includes a feedback loop to stabilize the laser against changes in its output due to aging, temperature variations and the like. Various schemes have been proposed. In one, the light output from one mirror of a semiconductor laser is coupled to an optical fiber for transmission purposes whereas the light output from the opposite mirror is detected by a photodiode. The electrical output of the photodiode is used in the feedback circuit to alter the drive current to the laser to compensate for variations in its light output. See copending application, Ser. No. 667,961 of I. Camlibel et al. filed on Mar. 18, 1976 and issued as U.S. Pat. No. 4,119,363 on Oct. 10, 1978, and assigned to the assignee hereof. This technique suffers from the disadvantage that the light outputs from the opposite mirrors of a semiconductor laser are not always identical; i.e., they do not necessarily track one another. Another scheme overcomes this problem by employing only the light emitted from one mirror into an optical fiber. The fiber is bifurcated into two segments having spaced, parallel beveled surfaces. A portion of the light incident on the beveled surfaces is reflected out of the fiber to a photodiode located in a feedback circuit as before. Unfortunately, this arrangement is sensitive to changes in the modal distribution of the light entering the fiber caused by shifting of the position of the lasing filament in the active region of the laser or of the fiber with respect to the active region. As described in copending application Ser. No. 861,288 of M. DiDomenico, Jr. et al. filed on Dec. 16, 1977 and issued as U.S. Pat. No. 4,165,496 on Aug. 21, 1979, and assigned to the assignee hereof, this problem can be alleviated by proper choice of the bevel angle or by positioning a steady state mode mixer between the laser and the beveled surfaces of the light tap.

SUMMARY OF THE INVENTION

In accordance with one aspect of our invention these problems of prior art light taps are substantially alleviated by using a photodiode to sample a small portion of the light output of a light source, such as laser, and converting that portion to an electrical signal in a feedback loop which controls the excitation of the source. The photodiode includes a light-absorbing layer, oriented to intercept the light beam emanating from the source, in which photocarriers are generated by photon absorption. The resulting photocurrent constitutes the electrical signal in the feedback loop. In order to function properly as a light tap the thickness and bandgap of the light-absorbing layer are mutually adapted so that only a small portion (e.g., 1%) of the incident light is absorbed therein (i.e., sampled), the remaining, major portion being transmitted therethrough to a utilization device.

In a preferred embodiment the photodiode (PD) is a double heterostructure (DH) including a semiconductor substrate on which are epitaxially grown a narrow bandgap, light-absorbing, semiconductor active layer disposed between, contiguous with, and substantially lattice-matched to, a pair of wider bandgap semiconductor cladding layers. A hole is formed in the substrate to expose one of the cladding layers (output layer) to allow insertion of an optical fiber therein. The light beam from the source is made incident on the other cladding layer (input layer) which acts as a window; i.e., its bandgap energy exceeds the quantum energy of the source so that the beam is transmitted through the cladding unabsorbed. However, upon reaching the active layer only a small portion of the beam is absorbed; that is, although the quantum energy of the beam exceeds the active layer bandgap energy, the active layer thickness is much less than an absorption length. Consequently, most of the beam is transmitted through the active layer and through the second cladding layer, which also acts as a window, into the optical fiber. The absorbed portion generates a photocurrent which, advantageously, is essentially linearly related to the intensity of the beam. This photocurrent is used to control the excitation of the source, such as a semiconductor junction laser. In addition, it is expected that this type of monitoring system will be substantially insensitive to changes in the mode distribution of the detected light because the sampling of the light to be controlled occurs as a result of direct absorption of the light and not by means of reflection and then absorption.

In order to increase optical coupling between the DH-PD and the source and/or optical fiber, the cladding layers may have lenses formed thereon either as an integral part thereof or as a discrete fixture thereto. Alternatively, where the source is a junction laser, its output face may be abutted against the input cladding provided that a suitable electrically insulative layer is disposed therebetween to prevent short circuiting the p-n junction of the laser.

In accordance with another aspect of our invention, a two-frequency telecommunication system includes a pair of optical transceivers coupled by an optical fiber, and at either (or both) transceivers a pair of tandem DH-PDs perform both the detection (demodulation) and feedback (sampling) functions.

BRIEF DESCRIPTION OF THE DRAWING

Our invention, together with its various features and advantages, can be readily understood from the following more detailed description taken in conjunction with the accompanying drawing, in which:

FIG. 1 is a schematic of an optical monitoring system in accordance with one embodiment of our invention in which a photodiode such as a DH-PD is used to sample the light emission of a light source such as a DH junction laser;

FIG. 2 is a similar to FIG. 1 but includes a lens formed on the input surface of the DH-PD;

FIG. 3 is a schematic of a two-frequency telecommunication system in accordance with another embodiment of our invention in which tandem DH-PDs are used both to sample light at one optical frequency emitted by a nearby source and to detect light at a different optical frequency emitted by a remote source.

DETAILED DESCRIPTION

Our optical monitoring system as shown in FIG. 1 includes an optical source 100 whose light output varies slowly in time as a result of temperature, aging or other phenomena. A control circuit 101 supplies excitation to source 100 to cause it to generate a light beam 140. In order to stabilize the beam 140 against such time varying changes in its intensity, photodiode (PD) 130 is positioned so as to intercept the beam, but the light-absorbing (active) layer 104 of the PD 130 is adapted so that only a small portion of the beam is absorbed (i.e., sampled). The remaining, major portion 140' of the beam is transmitted unabsorbed through the PD 130 to utilization means, e.g., a transmission medium such as optical fiber 108. The sampled portion of the beam generates a photocurrent in PD 130 which is applied to feedback means including feedback circuit 120. The output of feedback circuit 120 is coupled to control circuit 101 so as to vary the excitation to source 100 in such a way as to compensate for variations in the intensity of beam 140, thus rendering the beam intensity substantially constant in time with respect to the aforementioned slow varying changes (which is not to say, of course, that the beam intensity cannot be modulated with information).

Thus, modulation source 102 is optional depending on the system application, but in general is used to encode the light beam with information to be transmitted over optical fiber 108 to a remote location. Illustratively, modulation source 102 supplies a train of encoded electrical pulses to control circuit 101 which causes source 100 to turn on and off, thus producing a corresponding beam of optical pulses.

Of particular interest is the application of our monitoring system to controlling the light output of a semiconductor laser such as the double heterostructure (DH) junction laser 100 shown in FIG. 1. The DH laser, which is the primary candidate to serve as the carrier source in an optical telecommunication system, is well known in the art and so, for simplicity, only its basic components are depicted, i.e., an active layer 123 of a direct bandgap semiconductor material disposed between, and substantially lattice-matched to, a pair of opposite-conductivity-type, wider bandgap cladding layers 116 and 117. For simplicity also, electrodes 118 and 119 are shown as contacting directly the cladding layers 116 and 117 whereas in practice a contact-facilitating layer is typically interposed between layer 117 and electrode 119 and a substrate is interposed between layer 116 and electrode 118. Electrode 119 is usually shaped to form a stripe-geometry contact for constraining current to flow in a narrow channel (e.g., 5–12 μm wide) transverse to the layers. This geometry also narrows the beam dimension parallel to the layers. The end faces are typically cleaved parallel to one another and perpendicular to the layers to form an optical resonator.

In operation of the DH laser 100, the cladding layers are forward biased and pumping current from control circuit 101 is applied thereto above the lasing threshold. Stimulated (laser) emission is generated by the radiative recombination of holes and electrons in the active layer 123. This emission emanates from the laser 100 as light beam 140. Illustratively, DH laser 100 comprises an n-type, p-type or compensated $Al_xGa_{1-x}As$ ($0 \leq x \leq 0.4$) active layer 123, a p-type (or n-type) $Al_yGa_{1-y}As$ ($x < y \leq 1$) cladding layer 117 and an n-type (or p-type) $Al_zGa_{1-z}As$ ($x < z \leq 1$) cladding layer 116. Depending on the value of x, the light beam 140 will have a wavelength in the approximate range of 0.75 to 0.95 μm. Typical threshold currents range from about 80 to 120 mA. Other lattice-matched materials are also suitable (e.g., InP-InGaAsP; AlGaAs-AlGaAsP; GaAs-GaAsSb) depending on the light wavelength desired.

For the case in which the source 100 to be stabilized is a DH junction laser, the control circuit 101 typically includes a pre-biased transistor with the laser in its collector circuit as described by D. D. Sell in U.S. Pat. No. 4,009,385 issued on Feb. 22, 1977 and assigned to the assignee hereof. Modulation source 102 varies the drive current supplied by control circuit 101 and hence amplitude modulates the light beam 140. Illustratively, modulation source 102 varies the drive current between points above and below the lasing threshold so that the DH laser is turned on and off and the beam is pulse code modulated in accordance with information to be transmitted.

In any event, the preferred embodiment of PD 130 is also a double heterostructure which hereinafter will be designated as DH-PD 130. In a DH-PD, as shown in FIG. 1, the active semiconductor layer 104, where photons are absorbed and photocarriers are generated, is bounded by substantially lattice-matched, wider bandgap semiconductor layers 111 (input layer) and 112 (output layer). One of the wider bandgap layers, here shown to be layer 112, forms a p-n heterojunction 121 with one major surface of active layer 104 whereas the other wider bandgap layer forms a common-conductivity-type (i.e., n-n or p-p) heterojunction 122 with the opposite major surface. Layers 104, 111 and 112 are epitaxially grown, typically using liquid phase epitaxy (LPE), on a single-crystal substrate 103. A hole 109 is typically etched in the substrate so as to expose a portion of the underlying wide bandgap layer 112. Because the substrate 103 very often has nearly the same composition (i.e., bandgap) as the active layer 104, if the hole 109 were absent, light beam 140 would not be transmitted through the substrate without substantial absorption loss. The hole 109 thus enables optical fiber 108 to be inserted therein so that one end of the fiber is proximate the exposed portion of the wider bandgap layer 112.

Although DH-PD 130 is depicted as including a p-n heterojunction 121 at the interface between active layer 104 and layer 112, the p-n junction could also be a p-n homojunction located wholly within active layer 104. Alternatively, if the conductivity types of the layers in FIG. 1 are reversed (i.e., p-type substrate and p-p-n layers 112, 104, 111 thereon), then the p-n junction would be an n-p heterojunction at the interface between layers 111 and 104. In all of these cases, the p-n junction shall be considered to be "in" the active layer where it collects photocarriers generated by the absorption of beam 140.

In order to reduce reflection losses at the interface between the substrate and the wide bandgap output layer 112, the exposed portion of layer 112 is preferably provided with an anti-reflection (AR) coating 113. In this manner light beam 140 passes through wide bandgap input layer 111, which acts as a window, and is sampled by active layer 104 to generate a photocurrent which is applied to feedback circuit 120. The remaining, major portion 140' of the beam passes through wide bandgap output layer 112, which also acts as a window, to the optical fiber 108. To act as windows the bandgaps of layers 111 and 112 must exceed the quantum energy of the beam 140. In contrast, to absorb any portion of light beam 140, the bandgap of DH-PD active layer 104 must be not greater than the bandgap of DH laser active layer 123; i.e., the bandgap of active layer 104 must be less the quantum energy of light beam 140. In addition, in order to absorb (i.e., sample) only a small portion of light beam 140, the thickness t of an active layer 104 should be much less than the optical absorption length $1/\alpha_L$ of the material of layer 104; e.g., $\alpha_L t < 0.1$ means that less than 10% of beam 140 is absorbed. In contrast, if $t=3/\alpha_L$ then 99% of beam 140 would be absorbed and very little would reach fiber 108. In any event, the absorbed portion of beam 140 generates photocarriers which are confined by the p-p heterojunction 122 and collected by the p-n heterojunction 121 to generate a photocurrent between electrical contacts 114 and 115. Advantageously, this photocurrent is essentially linearly proportional to the intensity of beam 140 which greatly simplifies the feedback circuit 120 by eliminating the need for nonlinear compensation.

The contacts to the photodiode can take on a number of well-known geometric forms including the annular contact 115 to the substrate 103 and the apertured contact 114 to the wide bandgap layer 111. The aperture of the latter contact is filled with an AR coating 107 to enhance the coupling of beam 140 from DH laser 100 into DH-PD 130. To this end the beam 140 may also be passed through lens means 110 which focuses the beam diverging from laser active layer 123 onto AR coating 107.

As with the DH laser 100, the DH-PD 130 is typically fabricated of substantially lattice-matched Group III(a)-V(a) compounds such as GaAs-AlGaAs, GaAs-AlGaAsP, GaAs-GaAsSb, GaAs-AlGaP or InP-InGaAsP depending on the wavelength of radiation to be detected.

In a specific exemplary embodiment of a DH-PD 130, the various semiconductor layers are grown by LPE from the GaAs-AlGaAs system on a (100) n-type GaAs substrate 103 doped with Si to about $2 \times 10^{18}$ cm$^{-3}$. Active layer 104 comprises p-Al$_{0.02}$Ga$_{0.98}$As doped with Ge to $5 \times 10^{17}$ cm$^{-3}$ and about 0.1 μm thick, wide bandgap layer 111 comprises p-Al$_{0.24}$Ga$_{0.76}$As doped with Ge to $5 \times 10^{18}$ cm$^{-3}$ and about 2.2 μm thick, and wide bandgap layer 112 comprises n-Al$_{0.24}$Ga$_{0.76}$As doped with Te to $5 \times 10^{17}$ cm$^{-3}$ and about 4.5 μm thick. Layer 112 need not be grown directly on substrate 103; that is, a stop-etch layer (not shown) of n-Al$_{0.36}$Ga$_{0.64}$As doped with Te to $2 \times 10^{17}$ cm$^{-3}$ and 1 μm thick may be interposed between them so that, when the substrate is masked and etched to form hole 109, the etchant (a well-known peroxide solution buffered with ammonium hydroxide to a pH of about 8.5) effectively stops etching when it reaches interface 132. This stop-etch layer is optional, however, since the 24 percent aluminum composition of layer 112 can also perform the stop-etching action, albeit less effectively since the differential etching rate between GaAs and Al$_{-x}$Ga$_{1-x}$As is about 100:1 for x=0.24 and about 1000:1 for x=0.36.

Hole 109 typically has the shape of a truncated pyramid of rectangular cross section measuring approximately 250×250 μm at substrate surface 134 and approximately 200×200 μm at interface 132. The bottom of the hole is coated with a ZrO$_2$ AR coating 113 about 0.14 μm thick and then an annular Sn-Pd-Au alloy electrode is deposited using standard masking techniques. Similar techniques may be employed to form apertured Ti-Pt-Au contact 114.

In operation, to sample the 0.82 μm output beam of an AlGaAs DH laser 100, the DH-PD 130, with an 0.1 μm thick Al$_x$Ga$_{1-x}$As (x≲0.02) active layer 104, would absorb about 9% to 10% of the beam and generate photocurrent with a quantum efficiency exceeding 90%. Nearly all of remaining 90 to 91% of the beam (assuming small scattering and reflection losses) would be made incident on the end of fiber 108.

While the light output of laser 100 is shown to be coupled into the DH-PD 130 by lens means 110, one could instead simply abut the input surface 105 of the DH-PD 130 against the output mirror 106 of the laser 100. When using such an abutting configuration, an electrically insulative dielectric layer (not shown) should be interposed between the two to avoid short circuiting the laser. This layer may in fact be the AR coating 107 made of sufficiently large area to avoid shorting the p-n junction of DH laser 100.

In lieu of discrete lens means 110 or an abutting arrangement, the optical coupling between source 100 and DH-PD 130 may be enhanced as shown in FIG. 2 by forming, in the aperture of electrode 114, an integral lens 110′ by suitably etching the wide bandgap layer 111. In this case, the output face 106 of laser 100 is positioned a distance from DH-PD input surface 105 slightly greater than the focal length of lens 110′ in order to image the laser onto the end of fiber 108. In an illustrative case, layer 111 comprises Al$_y$Ga$_{1-y}$As (0.2≲y≲0.4) oriented perpendicular to the (100) direction and parallel to the (110) direction. Then, before depositing contact 114, suitable photolithographic masking can be used to form a concave, somewhat hemi-spherical or hemi-cylindrical lens 110′.

In practice lens 110′ could be fabricated as follows: obtain a (100) GaAs substrate (not shown in FIG. 2 and not substrate 103 which will be grown by LPE); mask the substrate and open a circular aperture in the mask; expose to an isotropic etchant such as H$_2$SO$_4$+$_{H_2O_2}$+$_{H_2O}$ to form a hole (i.e., curved depression) in the substrate; remove the mask; epitaxially grow (e.g., by LPE) layers 111, 104, 112 and 103 on the etched surface of the substrate so that layer 111 fills the depression; remove the substrate by exposing it to a selective etchant such as NH$_4$OH+H$_2$O$_2$ leaving layer 111 exposed and lens 110′ as the portion of layer 111 which had filled the curved depression in the now removed substrate; using standard photolithographic masking and etching, open hole 109 in layer 103; form the contacts and the AR coating.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention.

In particular, consider a dual frequency system as shown in FIG. 3 in which a source 100 at a nearby location emits a light beam 140 at one optical frequency $f_1$ over an optical fiber 108 to a remote location where a second source 200 emits another optical beam 178 at a different optical frequency $f_2$ (e.g., $f_1 > f_2$) over the same fiber 108 to the nearby location. At either location, for example the nearby one, it may be desired to perform two functions: (1) to sample the outgoing $f_1$-beam 140 generated by source 100 for stabilization purposes, and (2) to detect or demodulate the incoming $f_2$-beam 178 so as to extract power or information therefrom. A half-duplex system of this type is described by B. C. DeLoach, Jr. and us in a co-pending application entitled "Optical Telecommunications Systems," Ser. No. 918,404, filed on June 23, 1978 and assigned to the assignee hereof.

In order to perform both the sampling and demodulation functions, a pair of DH-PDs 150 and 152 are arranged in tandem and are separated by an electrically insulative layer 154. The substrate holes 156 and 158 of the DH-PDs are oriented to face the source 100 and the fiber 108 respectively. Lenses 164 and 166 may be formed on the portions of the wide bandgap layers 160 and 162 exposed by holes 156 and 158, respectively. These lenses may be fabricated using a process analogous to that employed to fabricate lens 110' of FIG. 2 except that, instead of totally removing the original substrate, holes 156 and 158 would be selectively etched to expose the lenses 164 and 166 formed in the depressions of those substrates.

In the DH-PD 150, which is nearest source 100, the active layer 168 has a bandgap adapted to absorb light at an optical frequency $f_2$ and, since $f_2 < f_1$, would also absorb light at an optical frequency of $f_1$ but for features of the structure to be described. In the DH-PD 152 nearest the fiber 108, on the other hand, the active layer 170 has a bandgap adapted to absorb radiation at an optical frequency $f_1$. Since $f_1 > f_2$, the bandgap of layer 170 can be adjusted such that it does not absorb light at an optical frequency of $f_2$.

In order to prevent the $f_1$-beam 140 emitted by source 100 from being absorbed by layer 168, a light transparent path 172, such as an elongated hole or channel, extends transversely through the layers of the DH-PDs 150 and 152 as well as through the insulating layer 154. The hole 172, which is axially aligned with the source 100 and the fiber 108, enables the $f_1$-beam 140 to be transmitted through the DH-PDs substantially unattenuated (except for small scattering losses) to the fiber 108 which carries the $f_1$-beam to the remote location.

To this end, lenses 164 and 166 are adapted so as to enhance the coupling of the $f_1$-beam into the fiber 108. For example, as is well known in the art, the lens 164 can be designed to collimate the $f_1$-beam and the lens 166 can be designed to focus the collimated beam into the fiber 108. Alternatively, the lens 166 may be omitted, and the lens 164 may be a relatively long focal length lens utilized to image the source 100 onto the end of the fiber 108. In the latter case, the source 100 and the lens 164 should be separated by distance slightly greater than the focal length F of lens 164 (e.g., at a distance of 1.3 F).

Most of the $f_1$-beam is coupled into the fiber 108 and transmitted to the remote location, but a small fraction 174 is reflected from the end of the fiber 108 and is redirected to the active layer 170 where it is absorbed. Since the light incident upon the layer 170 is already a small fraction of the $f_1$-beam, the thickness of the layer 170 should be at least 2-3 absorption lengths at $f_1$ in order to absorb 95 to 99% of the reflected portion 174 of the $f_1$-beam. The resulting photocurrent is taken from contact 176 of DH-PD 152 and applied to feedback circuit 120 in the fashion previously described.

It should be noted at this point that the $f_1$-beam being transmitted by fiber 108 may also experience reflections at other points in the system; for example, at optical connectors or splices, or at the detector at the remote location. However, because these reflections occur at points relatively far from the nearby location, the reflected components, upon returning through the fiber to the nearby location, would be substantially smaller than the component 174 because they experience attenuation in the fiber.

As mentioned previously, the source 200 at the remote location emits an $f_2$-beam 178 which is also carried by fiber 108 to the nearby location. Because of the numerical aperture of the fiber 108, the $f_2$-beam 178 emerges from the end of the fiber with a relatively large divergence angle. Thus, most of the $f_2$-beam is transmitted through the active layer 170 (since $f_2 < f_1$) and is absorbed by active layer 168, but little is transmitted through the hole 172. In order to absorb 95-99% of the incident $f_2$-beam, the layer 168 should also be at least 2-3 absorption lengths thick at $f_2$.

It is apparent that in DH-PD 152, which functions as an optical monitor for feedback stabilization, that the active layer 170 need not (and should not) be much less than an absorption length thick as contrasted with the systems of FIGS. 1 and 2 because it is only the reflected portion 174 of the $f_1$-beam which is made incident upon the active layer 170. On the other hand, if the hole 172 extends through only the DH-PD 150 and the insulating layer 154 but not through DH-PD 152, then the active layer 170 should be made much less than one absorption length thick as in the embodiments of FIGS. 1 and 2. The $f_1$-beam 140 thus would be sampled upon passing through the layer 170 and would thereby generate a photocurrent coupled through contact 176 to feedback circuit 120 for stabilization purposes. In this case, the reflected portion 174 of the $f_1$-beam would constitute an essentially in-phase component on the feedback signal as long as the distance between layer 170 and the end of fiber 108 is small compared to the shortest period for which the feedback circuit has to correct. If for any reason this reflected component is detrimental, it can be reduced to insignificant levels by putting an AR coating on the end of fiber 108.

In an alternative embodiment of the device of FIG. 3 in which the hole 172 extends through only DH-PD 150, layer 170 of DH-PD 152 can be made thinner at its center and thicker at outer portions away from the center so that the central portion samples the $f_1$-beam 140 and the outer portions totally absorb the reflected portions 174 of the $f_1$-beam.

Where feedback stabilization of source 100 is not required, the feedback circuit 120 and the connection thereby made between the control circuit 101 and contact 176 of DH-PD 152 would be omitted. In this case, the DH-PD 152 would simply function as a passive frequency filter which prevents reflected components of the $f_1$-beam (e.g., component 174) from being incident upon the active layer 168 where its absorption would constitute noise. In this embodiment, of course, the electrically insulating layer 154 may be omitted and the DH-PDs 150 and 152 can be directly abutted against one another (e.g., they could constitute an integrated structure formed by successively grown epitaxial layers). Of course, whether the DH-PD 152 functions solely as a passive filter or additionally as an optical monitor, the filtering function is inherent as long as the active layer 170 is made to be at least 2-3 absorption lengths thick at $f_1$, thus preventing reflected $f_1$-beam components from reaching the active layer 168.

In all of the embodiments described with reference to FIG. 3, the photocurrent generated by the absorption of the $f_2$-beam in layer 168 is coupled to utilization means 180 via contacts 182 and 184. By way of example, the utilization means might include an alert circuit for ringing a bell, or a demodulation circuit for driving a speaker, or various other components characteristic of a telephone station set as described in the aforementioned application of B. C. DeLoach, Jr. and us.

We claim:

1. A monitoring system comprising:

a source of optical radiation, feedback means for sensing the intensity of a portion of said radiation and for generating an electrical signal proportional thereto, control means for controlling the intensity of radiation from said source in response to said electrical signal, and utilization means for receiving said radiation, characterized in that, said feedback means comprises a double heterostructure photodiode which includes:

a pair of wide bandgap semiconductor layers transparent to said radiation, a light-absorbing semiconductor active layer interposed between and contiguous with said wide bandgap layers and oriented to intercept said radiation, said active layer having a bandgap and thickness which are mutually adapted to absorb only a small portion of said radiation and to transmit therethrough a major portion of said radiation to said utilization means, said utilization means including an optical fiber positioned to receive said radiation transmitted through said active layer, and a p-n junction in said active layer for collecting photocarriers generated by the absorption of said radiation in said active layer, thereby to produce in said photodiode a photocurrent which is essentially linearly proportional to the intensity of said radiation, said photocurrent constituting said electrical signal to which said control means is responsive, further characterized in that said system includes a first transceiver station including said source ($f_1$-source) for transmitting said beam of optical frequency $f_1$ ($f_1$-beam) over said fiber, a remote transceiver station for receiving said $f_1$-beam and including another optical source ($f_2$-source) for transmitting a beam of optical frequency $f_2$ ($f_2$-beam), $f_1 > f_2$, over said fiber to said first station, said first station including said double heterostructure photodiode ($f_1$-PD) disposed between said $f_1$-source and said fiber, a second double heterostructure photodiode ($f_2$-PD) disposed between said $f_1$-source and said $f_1$-PD and including an active layer having a thickness and bandgap adapted to absorb substantially all of said $f_2$-beam incident thereon, thereby generating a photocurrent in response to the absorption of said $f_2$-beam, and second utilization means to which said photocurrent of said $f_2$-PD is applied, said $f_2$-PD having a light transparent path extending transversely therethrough to prevent substantial absorption of said $f_1$-beam by said active layer of said $f_2$-PD.

2. The system of claim 1 wherein said $f_2$-PD and said $f_1$-PD comprise a unitary structure and including an electrically insulative layer separating them from one another.

3. The system of claim 1 including lens means disposed between said $f_1$-source and said $f_2$-PD effective to image said $f_1$-source onto the end of said fiber which is adjacent said $f_1$-PD.

4. A dual frequency optical communication system comprising a first transceiver station including an optical $f_1$-source for generating a beam of optical frequency $f_1$, a remote transceiver station including an optical $f_2$-source for generating a beam of optical frequency $f_2$ ($f_1 > f_2$), an optical fiber for carrying said $f_1$-beam from said first station to said remote station and for carrying said $f_2$-beam from said remote station to said first station, a pair of photodiodes arranged in tandem between said $f_1$-source and said fiber so that one of said photodiodes is nearest said $f_1$-source and the other is nearest said fiber, said photodiode nearest said $f_1$-source having an active layer effective to absorb substantially all of said $f_2$-beam received from said remote station, said photodiode nearest said fiber having an active layer effective to absorb substantially all of that portion of said $f_1$-beam which is reflected from the end of said fiber, said photodiodes having a light transparent path extending transversely therethrough so that said $f_1$-beam is transmitted from said $f_1$-source to said fiber substantially unabsorbed.

* * * * *